(12) United States Patent
Kim et al.

(10) Patent No.: US 9,508,954 B2
(45) Date of Patent: Nov. 29, 2016

(54) ORGANIC LIGHT-EMITTING DISPLAY APPARATUS AND METHOD OF MANUFACTURING THE SAME

(71) Applicant: Samsung Display Co., Ltd., Yongin-si, Gyeonggi-do (KR)

(72) Inventors: Sung-Chul Kim, Yongin (KR); Myung-Soo Huh, Yongin (KR); Chang-Woo Shim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 15/146,518

(22) Filed: May 4, 2016

(65) Prior Publication Data

US 2016/0248046 A1  Aug. 25, 2016

Related U.S. Application Data

(62) Division of application No. 13/962,855, filed on Aug. 8, 2013, now Pat. No. 9,356,257.

(30) Foreign Application Priority Data

Apr. 3, 2013 (KR) ........................ 10-2013-0036442

(51) Int. Cl.
*H01L 21/00* (2006.01)
*H01L 51/52* (2006.01)
*H01L 51/56* (2006.01)
*H01L 51/00* (2006.01)
*H01L 27/32* (2006.01)

(52) U.S. Cl.
CPC ....... *H01L 51/5256* (2013.01); *H01L 51/0034* (2013.01); *H01L 51/56* (2013.01); *H01L 27/3246* (2013.01); *H01L 27/3258* (2013.01); *H01L 27/3262* (2013.01); *H01L 27/3274* (2013.01); *H01L 51/5218* (2013.01); *H01L 2227/323* (2013.01); *H01L 2251/303* (2013.01); *H01L 2251/5338* (2013.01); *H01L 2251/558* (2013.01)

(58) Field of Classification Search
USPC .............................................. 438/26; 257/40
See application file for complete search history.

(56) References Cited

U.S. PATENT DOCUMENTS

| 7,682,851 | B2 | 3/2010 | Lee et al. |
| 8,593,060 | B2 | 11/2013 | Lee et al. |
| 2007/0172971 | A1 | 7/2007 | Boroson |
| 2007/0181872 | A1 | 8/2007 | Lee et al. |

(Continued)

FOREIGN PATENT DOCUMENTS

| KR | 10-0912779 B1 | 8/2009 |
| KR | 10-2012-0109083 A | 10/2012 |

*Primary Examiner* — Telly Green
(74) *Attorney, Agent, or Firm* — Knobbe Martens Olson & Bear LLP

(57) ABSTRACT

In an aspect, an organic light-emitting display apparatus and a method of manufacturing the same are provided. The organic light-emitting display apparatus may include a substrate; a display unit formed on the substrate; and a thin film encapsulating layer encapsulating the display unit. The thin film encapsulating layer may include a plurality of organic layers and inorganic layers that are laminated alternately. At least one of the plurality of the inorganic films may include a first layer formed of a first material, a second layer formed of a second material other than the first material, and an intermediate layer provided between the first and second layers.

9 Claims, 2 Drawing Sheets

(56) References Cited

U.S. PATENT DOCUMENTS

| | | |
|---|---|---|
| 2008/0169758 A1 | 7/2008 | Cok |
| 2008/0203907 A1 | 8/2008 | Lee et al. |
| 2008/0272367 A1 | 11/2008 | Cok |
| 2010/0041213 A1 | 2/2010 | Lee |
| 2012/0241811 A1 | 9/2012 | Kim et al. |
| 2013/0062659 A1 | 3/2013 | Lee et al. |

ORGANIC LIGHT-EMITTING DISPLAY APPARATUS AND METHOD OF MANUFACTURING THE SAME

INCORPORATION BY REFERENCE TO RELATED APPLICATIONS

Any and all priority claims identified in the Application Data Sheet, or any correction thereto, are hereby incorporated by reference under 37 CFR 1.57. For example, this application is a divisional of and claims priority to U.S. application Ser. No. 13/962,855, filed Aug. 8, 2013 which claims priority to and the benefit of Korean Patent Application No. 10-2013-0036442, filed on Apr. 3, 2013, in the Korean Intellectual Property Office, the disclosure of which is incorporated herein in its entirety by reference.

BACKGROUND

Field

This disclosure relates to an organic light-emitting display apparatus and a method of manufacturing the same, and more particularly, to an organic light-emitting display apparatus including an improved encapsulating layer and a method of manufacturing the organic light-emitting display apparatus.

Description of the Related Technology

An organic light-emitting display apparatus includes a hole injecting electrode, an electron injecting electrode, and an organic light-emitting device (OLED) including an organic light-emitting layer formed between the hole injecting electrode and electron injecting electrode. Generally, an organic light-emitting display apparatus is a self-luminescent display device, in which holes injected using the hole injecting electrode and electrons injected using the electron injecting electrode are combined in the organic light-emitting layer to generate an exciton, and then, the exciton falls from an excited state to a ground state and generates light.

An organic light-emitting display apparatus does not require a separate light source. Therefore, the organic light-emitting display apparatus may be operated using low voltage, be lightweight and thin, and provide high-quality features such as a wide viewing angle, high contrast and fast response speed. Thus, an organic light-emitting display apparatus receives consideration as a next-generation display apparatus. However, the organic light-emitting display apparatus may be degraded due to external moisture or oxygen, and the like. Typically, the organic light-emitting device must be encapsulated to protect the OLED from external moisture or oxygen, and the like.

SUMMARY

The present disclosure provides an organic light-emitting apparatus including an improved moisture-proof encapsulating layer and a method of manufacturing of the organic light-emitting apparatus.

According to an aspect of the present disclosure, there is provided an organic light-emitting display apparatus including a substrate; a display unit formed on the substrate; and a thin film encapsulating layer encapsulating the display unit; in which the thin film encapsulating layer includes a plurality of organic layers and inorganic layers that are alternately laminated thereon; in which at least one of the plurality of the inorganic layers includes a first layer formed of a first material, a second layer formed of a second material other than the first material, and an intermediate layer provided between the first and second layers; in which the intermediate layer comprises the first and second materials.

In some embodiments, the first, intermediate, and second layers may be sequentially laminated, and repeatedly laminated multiple times.

In some embodiments, the first material may be silicon oxide and the second material may be aluminum oxide.

In some embodiments, a thickness of the intermediate layer may range from about 50 Å to about 200 Å.

In some embodiments, a thickness of the first and second layers may range from about 100 Å to about 500 Å.

In some embodiments, a thickness of the first and second layers may range from about 100 Å to about 200 Å.

In some embodiments, areas of the inorganic layers may be larger than the areas of the organic layers. In some embodiments, at least one organic layer includes polyurea or polyacrylate. In some embodiments, the plurality of organic layers include polyurea or polyacrylate.

According to another aspect of the present disclosure, there is provided a method of manufacturing an organic light-emitting display apparatus, the method including forming a display unit on a substrate; and alternately laminating an organic layer and an inorganic layer on the display unit; in which the forming of the inorganic layer includes forming a first layer; performing plasma treatment on a surface of the first layer; forming an intermediate layer on the plasma treated layer; and forming a second layer on the intermediate layer. In some embodiments, the organic layer includes polyurea or polyacrylate.

In some embodiments, the first layer may be formed of a first material, the second layer may be formed of a second material other than the first material, and the intermediate layer may be formed of a material that includes the first and second materials.

In some embodiments, the first material may be silicon oxide and the second material may be aluminum oxide.

In some embodiments, the first, intermediate, and second layers may be formed by using atomic layer deposition (ALD).

In some embodiments, a thickness of the intermediate layer may range from about 50 Å to about 200 Å.

In some embodiments, a thickness of the intermediate layer may range from about 50 Å to about 100 Å.

In some embodiments, a thickness of the first and second layers may range from about 100 Å to about 500 Å.

In some embodiments, a thickness of the first and second layers may range from about 100 Å to about 200 Å.

BRIEF DESCRIPTION OF THE DRAWINGS

The above and other features and advantages of the present disclosure will become more apparent by describing in detail exemplary embodiments thereof with reference to the attached drawings in which.

DETAILED DESCRIPTION

Figure 1:
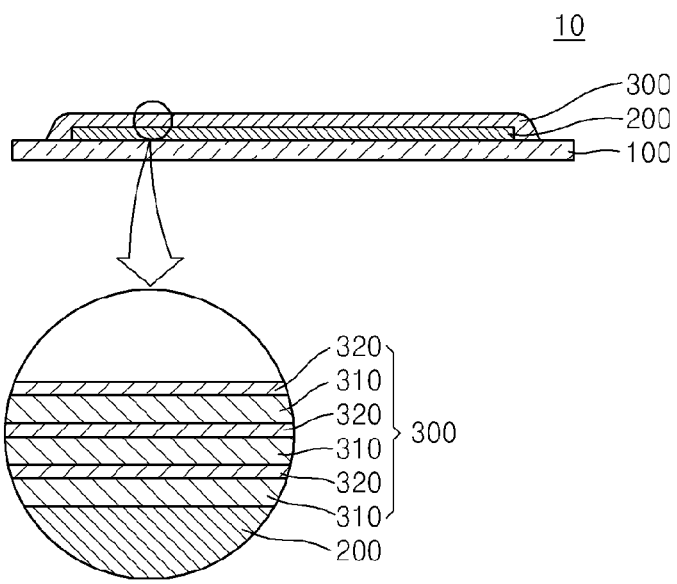
FIG. 1 is a cross-sectional view illustrating an organic light-emitting display apparatus according to an embodiment.

The present disclosure should not be construed as limited to the embodiments set forth herein; rather, these embodiments are provided so that this disclosure will be thorough and complete. In the description, if it is determined that a detailed description of commonly-used technologies or structures related to the embodiments may unintentionally obscure the subject matter of the embodiments, the detailed description thereof will be omitted.

It will be understood that although the terms first and second are used herein to describe various elements, these elements should not be limited by these terms. These terms are only used to distinguish one element from another element.

It will be understood that when an element or layer is referred to as being "on" another element or layer, the element or layer can be directly on another element or layer or intervening elements or layers.

Hereinafter, embodiment of the present disclosure will be described more fully with reference to the accompanying drawings, in which illustrative embodiments of the disclosure are shown. Like reference numerals in the drawings denote like elements, and thus their description will be omitted. In the drawings, the thicknesses of layers and regions may be exaggerated for the convenience of description.

As used herein, the term "and/or" includes any and all combinations of one or more of the associated listed items.

Figure 2:
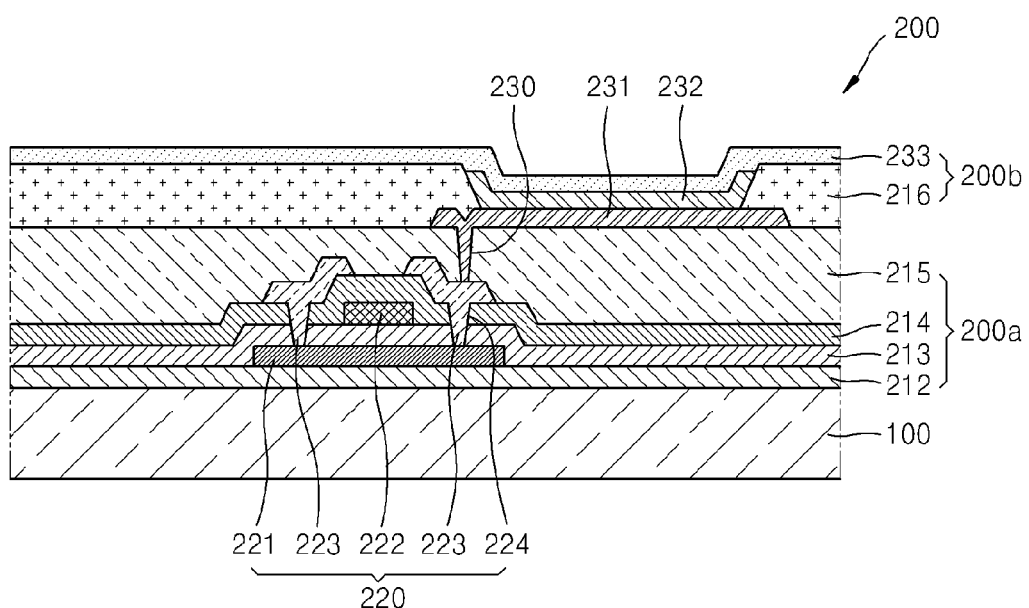
FIG. 2 is a magnified view of a portion of a display unit of the organic light-emitting display apparatus of FIG. 1.

FIG. 1 is a cross-sectional view illustrating an organic light-emitting display apparatus 10 according to an embodiment of the present invention. FIG. 2 is a magnified view of a portion of a display unit 200 of the organic light-emitting display apparatus 10 of FIG. 1.

Referring FIGS. 1 and 2, the organic light-emitting display apparatus 10 may include a substrate 100, a display unit 200 formed on the substrate 100, and an encapsulating layer 300 encapsulating the display unit 200.

In some embodiments, the substrate 100 may be flexible, and formed of plastic having high heat resistance and high durability such as polyimide, polyethylene terephthalate (PET), polycarbonate, polyethylene naphthalate, polyarylate (PAR), polyetherimide. However, the present embodiments are not limited thereto, and the substrate 100 may be formed of various materials such as metal or glass.

In some embodiments, the display unit 200 may include a thin film transistor (TFT) layer 200a which is an organic thin film transistor (OTFT) and a pixel unit 200b. In some embodiments, the pixel unit 200b may be an organic light-emitting device (OLED). Hereinafter, the display unit 200 will be described in more detail with reference to FIG. 2.

In some embodiments, a buffer layer 212 may be formed on the substrate 100. In some embodiments, the buffer layer 212 which may function to block impurities from penetrating through the substrate 100, and planarize a top surface of the substrate 100 may be formed of various materials for performing the functions.

For example, the buffer layer 212 may include an inorganic material such as silicon oxide, silicon oxynitride, aluminum oxide, aluminum nitride, titanium oxide, or titanium nitride, or an organic material such as polyimide, polyester, or acryl. In some embodiments, the buffer layer 212 may be formed as a plurality of laminates using the materials described above.

In some embodiments, the thin film transistor (TFT) layer 200a may be formed on the buffer layer 212. A top-gate type TFT is provided as an example of the TFT layer 200a in the present embodiments. However, other types of TFTs may be provided.

In some embodiments, the TFT layer 200a may include an active layer 221, a gate electrode 222, and source and drain electrodes 223.

In some embodiments, the active layer 221 may be formed on the buffer layer 212 by using a semiconductor material. In some embodiments, a gate insulating layer 213 may be formed to cover the active layer 221. In some embodiments, the active layer 221 may be formed using an inorganic semiconductor such as amorphous silicon or polysilicon, or an organic semiconductor, and may include a source region and a drain region, and a channel region between the source and drain regions. In some embodiments, the gate insulating layer 213 may be present to insulate the active layer 221 and the gate electrode 222, and may be formed of an organic material, or an inorganic material such as SiNx, or $SiO_2$.

In some embodiments, the gate electrode 222 may be provided on the gate insulating layer 213, and an interlayer insulating layer 214 may be formed to cover the gate electrode 222.

In some embodiments, the gate electrode 222 may include gold (Au), silver (Ag), copper (Cu), nickel (Ni), platinum (Pt), palladium (Pd), aluminum (Al), molybdenum (Mo), or an alloy such as a Al—Nd alloy, a Mo—W alloy. However, the gate electrode 222 is not limited thereto, and may include various materials in consideration of the manufacturing conditions of the organic light-emitting display apparatus 10.

In some embodiments, the interlayer insulating layer 214 may be provided between the gate electrode 222 and the source and drain electrodes 223, to insulate the gate electrode 222 and the source and drain electrodes 223. The interlayer insulating layer 214 may be formed of an inorganic material such as SiNx, $SiO_2$.

In some embodiments, the source and drain electrodes 223 may be formed on the interlayer insulating layer 214. In some embodiments, the interlayer insulating layer 214 and the gate insulating layer 213 may be formed to expose the source and drain regions of the active layer 221. In some embodiments, the source and drain electrodes 223 may be formed to touch the exposed source and drain regions of the active layer 221.

FIG. 2 illustrates an example of the top-gate type TFT, which sequentially includes the active layer 221, the gate electrode 222, and the source and drain electrodes 223. However, the present embodiments are not limited thereto. In some embodiments, the gate electrode 222 may be provided under the active layer 221.

In some embodiments, the TFT layer 200a as described above may be electrically connected to the pixel unit 200b and may operate the pixel unit 200b, and may be covered with a planarization layer 215 which protects the TFT layer 200a.

In some embodiments, the planarization layer 215 may be an inorganic insulating layer and/or an organic insulating layer. In some embodiments, the inorganic insulating layer may include $SiO_2$, SiNx, SiON, $Al_2O_3$, $TiO_2$, $Ta_2O_5$, $ZrO_2$, BST, or PZT. In some embodiments, the organic insulating layer may include a general purpose polymer (e.g., poly (methyl methacrylate) (PMMA) or polystyrene (PS)), a polymer derivative including a phenol-based group, an acryl-based polymer, an arylether-based polymer, an amide-based polymer, a fluorine-based polymer, a p-xylene-based polymer, a vinyl alcohol-based polymer, or a compound thereof. In some embodiments, the planarization layer 215 may be a composite laminate formed of the inorganic and organic layers.

In some embodiments, the pixel unit 200b may be formed on the planarization layer 215. In some embodiments, the pixel unit 200b may include a pixel electrode 231, an intermediate layer 232, and an opposite electrode 233.

In some embodiments, the pixel electrode 231 may be formed on the planarization layer 215, and electrically connected to the source and drain electrodes 223 through a contact hole 230 formed in the planarization layer 215.

In some embodiments, the pixel electrode 231 may be a reflective electrode, and may include a reflecting layer formed of Ag, magnesium (Mg), Al, Pt, Pd, Au, Ni, neodymium (Nd), iridium (Ir), chromium (Cr), or a compound thereof, and a transparent or semitransparent electrode layer formed on the reflecting layer. The transparent or semitransparent electrode layer may include at least one selected from the group consisting of indium tin oxide (ITO), indium zinc oxide (IZO), zinc oxide (ZnO), indium oxide ($In_2O_3$), and indium gallium oxide (IGO).

In some embodiments, the opposite electrode 233 may be provided to face the pixel electrode 231. In some embodiments, the opposite electrode 233 may be a transparent or semitransparent electrode, and formed of a metal thin film having a low work function which includes lithium (Li), calcium (Ca), LiF/Ca, LiF/Al, Al, Ag, Mg, or a compound thereof. In some embodiments, an auxiliary electrode layer or a bus electrode may be further formed on the metal thin film by using a material for forming a transparent electrode such as ITO, IZO, ZnO, or $In_2O_3$.

Therefore, the opposite electrode 233 may transmit therethrough light emitted from an organic light-emitting layer included in the intermediate layer 232. That is, the light emitted from the organic light-emitting layer may be reflected directly or by the pixel electrode 231 which is a reflective electrode, toward the opposite electrode 233.

However, the organic light-emitting display apparatus 10 according to the present embodiments is not limited to a top-emission type, but may be a bottom-emission type in which the light emitted from the organic light-emitting layer is emitted toward the substrate 100. In this case, the pixel electrode 231 may be a transparent or semitransparent electrode, and the opposite electrode 233 may be a reflective electrode. Also, the organic light-emitting display apparatus 10 according to the present embodiment may be a both emission type in which the light is emitted from both top and bottom.

In some embodiments, a pixel defining layer 216 may be formed on the pixel electrode 231 by using an insulating material. In some embodiments, the pixel defining layer 216 exposes a predetermined area of the pixel electrode 231. In some embodiments, the intermediate layer 232 which includes the organic light-emitting layer is provided in the exposed area.

In some embodiments, the organic light-emitting layer may be formed of a low molecular weight organic material or a high molecular weight organic material. In addition to the organic light-emitting layer, the intermediate layer 232 may selectively further include a functional layer such as a hole transport layer (HTL), a hole injection layer (HIL), an electron transport layer (ETL), or an electron injection layer (EIL).

Referring back to FIG. 1, the encapsulating layer 300 encapsulates the display unit 200 to protect the display unit 200 from external moisture or oxygen and thus prevent the display unit 200 from being degraded. In some embodiments, the encapsulating layer 300 may include a plurality of organic layers 310 or inorganic layers 320 that are alternately laminated.

Also, although not illustrated in FIG. 1, a protective layer (not shown) including a capping layer (not shown) may be further provided on the opposite electrode 233. The capping layer may be formed of an organic material such as a-NPD, NPB, TPD, m-MTDATA, Alq3, or CuPc. In some embodiments, the capping layer may not only protect the OLED, but also support efficient light-emission of the OLED.

In some embodiments, the organic layer 310 reduces internal stress of the inorganic layer 320 and fills in tiny cracks and pin holes formed in the inorganic layer 320 to effectively protect the display unit 200 from external moisture or oxygen. In some embodiments, the organic layer 310 may be formed of a flexible organic material such as polyurea or polyacrylate, but is not limited thereto.

In some embodiments, the inorganic layer 320 may be formed of an inorganic material having improved moistureproof ability to protect the display unit 200 from external moisture or oxygen. In some embodiments, the inorganic layer 320 may be formed of SiNx, $Al_2O_3$, $SiO_2$, or $TiO_2$, but is not limited thereto.

In some embodiments, the area of the inorganic layer 320 may be greater than the area of the organic layer 310 to surround the organic layer 310. Therefore, an outer portion of the encapsulating layer 300 includes the inorganic layer 320 which is moistureproof, and an inner portion thereof includes the organic layer 310 which is vulnerable to moisture, but flexible. Thus, the encapsulating layer 300 which is flexible and moistureproof may be embodied.

In some embodiments, the, at least one of the plurality of inorganic layers 320 may include a first layer 322, a second layer 342, and an intermediate layer 326 displaced between the first and second layers 322 and 324. In some embodiments, the encapsulating layer 300 may be further improved in blocking external moisture, which will be described in detail with reference to FIG. 3.

Figure 3:
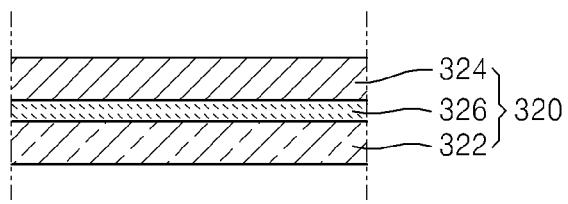
FIGS. 3 and 4 are magnified views illustrating structures of an inorganic film of the organic light-emitting display apparatus of FIG. 1.
Figure 4:
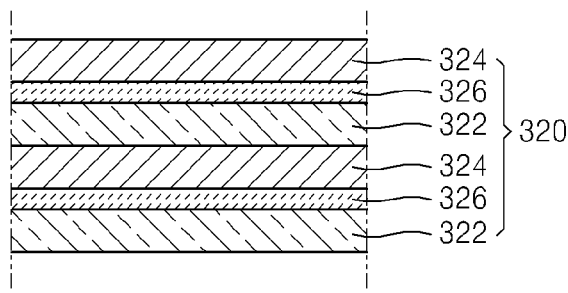

FIGS. 3 and 4 are magnified views illustrating structures of an inorganic film of the organic light-emitting display apparatus 10 of FIG. 1. Hereinafter, FIGS. 3 and 4 will be described with reference to FIG. 1.

First, referring to FIG. 3, at least one of the plurality of inorganic layers 320 may include the first layer 322, the second layer 324, and the intermediate layer 326. In some embodiments, the intermediate layer 326 may be disposed between the first and second layers 322 and 324. In some embodiments, the first layer 322, the intermediate layer 326, and the second layer 324 are sequentially laminated.

In some embodiments, the first layer 322 may include a first material, and the second layer 324 may include a second material other than the first material. In some embodiments, the intermediate layer 326 may include both the first and second materials.

For example, the first material may be silicon oxide, and the second material may be aluminium oxide. Silicon oxide and aluminium oxide are both excellent moistureproof materials. However, if the inorganic layer 320 is formed of only silicon oxide or aluminium oxide, the inorganic layer 320 may be formed to be a single layer, and thus, a thickness of the inorganic layer 320 has to increase to protect the display unit 200 from external moisture or oxygen. If the thickness of the inorganic layer 320 increases, layer stress of the inorganic layer 320 also increases. Therefore, the inorganic layer 320 may be delaminated, and external moisture or oxygen may be permeated into the OLED.

However, according to an aspect of the present embodiments, the inorganic layer 320 may include the first and second layers 322 and 324. Therefore, the layer stress in each of the first and second layers 322 and 324 may be reduced. In some embodiments, the inorganic layer 320 may not be delaminated since the layer stress in the entire inorganic layer 320 may be reduced.

In some embodiments, since the first layer 322 may be formed of silicon oxide and the second layer 324 may be formed of aluminium oxide, the inorganic layer 320 may include the features of both silicon oxide and aluminium oxide. In addition, the first and second layers 322 and 324 may make up for defects such as pin holes therein. In some embodiments, the display unit 200 may be effectively protected from external moisture or oxygen, and the thickness of the inorganic layer 320 may be reduced. Therefore, the manufacturing yield of the organic light-emitting display apparatus 10 may be increased.

In some embodiments, the intermediate layer 326 may be formed of both the first and second materials. Therefore, the first and second layers 322 and 324, which are formed of different materials and thus have different crystalline structures, may be more firmly bonded. For example, the intermediate layer 326 may be formed of silicon oxide in which a portion of oxygen is activated and combined with aluminium.

In some embodiments, a thickness of the intermediate layer 326 as described above may range from about 50 Å to about 200 Å, and preferably, from about 50 Å to about 100 Å.

If the thickness of the intermediate layer 326 is less than about 50 Å, an adhesive force between the first and second layers 322 and 324 may be weak. As will be described below, first, plasma treatment is performed on the first layer 322, and then the intermediate layer 326 is formed. If the thickness of the intermediate layer 326 is larger than about 200 Å, the plasma treatment will be performed excessively on the first layer 322 and thus damage the first layer 322. Therefore, the thickness of the intermediate layer 326 being less than about 200 Å is preferable.

In some embodiments, the intermediate layer 326 may be formed by using atomic layer deposition (ALD). Thus, to reduce manufacturing hours and increase yields, the thickness of the intermediate layer 326 may preferably range from about 50 Å to about 100 Å. If the thickness of the intermediate layer 326 ranges from about 50 Å to about 100 Å, the first and second layers 322 and 324 may be more securely bonded to each other and stress of the inorganic layer 320 may be reduced.

Thicknesses of the first and second layers 322 and 324 may range from about 100 Å to about 500 Å, and preferably, from about 100 Å to 200 Å. In some embodiments thicknesses of the first and second layer 322 and 324 may be different from each other.

If the thicknesses of the first and second layers 322 and 324 are less than 100 Å, external oxygen and moisture may be relatively easier to be permeated through the intermediate layer 326. However, if the thicknesses of the first and second layers 322 and 324 are larger than about 500 Å, layer stress may occur in the first and second layers 322 and 324 and thus, cracks may appear thereon.

Meanwhile, as will be described below, the first and second layers 322 and 324 may be formed by using ALD. Thus, to reduce manufacturing hours and increase yields, the thicknesses first and second layers 322 and 324 may range from about 100 Å to about 200 Å.

FIG. 4 illustrates an example where the first, intermediate, and second layers 322, 326, and 324 are repeatedly laminated two times.

As in FIG. 4, if the first, intermediate, and second layers 322, 326, and 324 are repeatedly laminated, thicknesses of the first, intermediate, and second layers 322, 326, and 324 may be reduced. As such, if the thicknesses of the first, intermediate, and second layers 322, 326, and 324 that form the inorganic layer 320 are thin and alternately laminated, cracks may not appear on the inorganic layer 320, and an effective barrier which protects the display unit 200 from external moisture or oxygen may be formed.

Although an example where the first, intermediate, and second layers 322, 326, and 324 are repeatedly laminated two times is illustrated in FIG. 4, the present invention is not limited thereto. In some embodiments, the first, intermediate, and second layers 322, 326, and 324 may be repeatedly laminated three or more times.

Hereinafter, a method of manufacturing the organic light-emitting display apparatus 10 will be described in detail with reference to FIGS. 1 and 3.

In some embodiments, the method of manufacturing the organic light-emitting display apparatus 10 may include forming the display unit 200 on the substrate 100, and forming the encapsulating layer 300 encapsulating the display unit 200.

In some embodiments, the display unit 200 may not only have a structure of FIG. 2, but also be any of various organic light-emitting displays that are publicly known. Thus, detailed description thereof will be omitted.

Although not shown in the drawings, before forming the encapsulating layer 300, the passivation layer may be formed on the display unit 200. In some embodiments, the passivation layer may include the capping layer which may be formed of an organic material such as a-NPD, NPB, TPD, m-MTDATA, Alq3, or CuPc.

In some embodiments, the organic and inorganic layers 310 and 320 may be alternately laminated on the display unit 200 to form the encapsulating layer 300.

In some embodiments, the organic layer 310 may be formed to a predetermined thickness of, for example, about 30000 Å to smooth a level difference due to the pixel defining layer 216. In some embodiments, the organic layer 310 may be formed by evaporating and depositing a liquid monomer, and then radiating ultraviolet rays to the liquid monomer to polymerize the liquid monomer as a polymer.

In some embodiments, a method of manufacturing the inorganic layer 320 may include forming the first layer 322, performing the plasma treatment on a surface of the first layer 322, forming the intermediate layer 326 on the plasma treated first layer 322, and forming the second layer 324 on the intermediate layer 326.

In some embodiments, the first layer 322 may be a silicon oxide layer, and may be formed by using ALD.

ALD is a method including injecting a raw gas to a substrate, performing a purging and pumping process to thus adsorb a single molecular layer or multiple molecular layers of the raw gas onto the substrate, and then, adsorbing another raw gas, and performing the purging and pumping process to form a desirable single atomic layer of or multiple atomic layers of the raw gas. When using the ALD, a thickness of the substrate may be adjusted in units of atoms, and a density of the pin holes in a thin film formed using the ALD is very low, but a density of the thin film is high.

For example, the first layer 322 may be formed by injecting a raw gas $SiH_2Cl_3$ to the substrate 100 on which the display unit 200 is formed, performing the purging and pumping process, injecting a reaction gas including oxygen radicals, and performing the purging and pumping process.

In some embodiments, the intermediate layer 326 may be formed by exposing the first layer 322 to hydrogen plasma to thus increase reaction between oxygen and a silicon oxide layer, activating the surface of the first layer 322, and depositing aluminium on the first layer 322

Using the ALD, the intermediate layer 326 may be formed by injecting a gas including Al atoms, such as trimethyl aluminium (TMA), onto the first layer 322 whose surface is activated.

In some embodiments, the second layer 324 may be an aluminium oxide layer, and be formed by using the ALD.

For example, the second layer 324 may be formed by injecting a raw gas TMA to the intermediate layer 326, performing the purging and pumping process, injecting a reaction gas including oxygen radicals, and performing the purging and pumping process.

In some embodiments, the inorganic layer 320 may be formed by repeatedly laminating the first, intermediate, and second layers 322, 326, and 324.

According to the one or more embodiments of the present disclosure, an encapsulating layer having improved moisture proof ability may be provided. Also, since thicknesses of inorganic layers of the encapsulating layer may be reduced, the manufacturing yield of an organic light-emitting display apparatus may be improved.

While the present disclosure has been particularly shown and described with reference to exemplary embodiments thereof, it will be understood by those of ordinary skill in the art that various changes in form and details may be made therein without departing from the spirit and scope of the claims.

What is claimed is:

1. A method of manufacturing an organic light-emitting display apparatus, the method comprising:
   forming a display unit on a substrate; and
   alternately laminating an organic layer and an inorganic layer on the display unit;
   wherein the forming of the inorganic layer comprises:
   forming a first layer;
   performing plasma treatment on a surface of the first layer;
   forming an intermediate layer on the plasma treated layer; and
   forming a second layer on the intermediate layer.

2. The method of claim 1, wherein the first layer is formed of a first material, the second layer is formed of a second material other than the first material, and the intermediate layer is formed of a material that comprises the first and second materials.

3. The method of claim 2, wherein the first material is silicon oxide and the second material is aluminum oxide.

4. The method of claim 1, wherein the first, intermediate, and second layers are formed by using atomic layer deposition (ALD).

5. The method of claim 1, wherein a thickness of the intermediate layer ranges from about 50 Å to about 200 Å.

6. The method of claim 3, wherein a thickness of the intermediate layer ranges from about 50 Å to about 100 Å.

7. The method of claim 1, wherein a thickness of the first and second layers ranges from about 100 Å to about 500 Å.

8. The method of claim 7, wherein a thickness of the first and second layers ranges from about 100 Å to about 200 Å.

9. The method of claim 1, wherein the organic layer comprises polyurea or polyacrylate.

\* \* \* \* \*